United States Patent [19]

Diedrich et al.

[11] Patent Number: 4,571,073
[45] Date of Patent: Feb. 18, 1986

[54] APPARATUS FOR THE EXPOSURE OF PHOTOSENSITIVE PLATES ON TWO SIDES

[75] Inventors: Klaus Diedrich, Rödermark; Helmar Weis, Münster, both of Fed. Rep. of Germany

[73] Assignee: Firma Wilhelm Staub GmbH, Fed. Rep. of Germany

[21] Appl. No.: 543,064

[22] Filed: Dec. 19, 1983

[30] Foreign Application Priority Data

Oct. 18, 1982 [DE] Fed. Rep. of Germany ....... 3238495

[51] Int. Cl.$^4$ ............................................. G03B 27/04
[52] U.S. Cl. ....................................... 355/89; 355/99; 271/5; 271/186; 271/196
[58] Field of Search ....................... 355/26, 99, 89, 24, 355/30, 85, 86, 93, 94, 103, 127; 271/5, 11, 14, 65, 186, 196

[56] References Cited

U.S. PATENT DOCUMENTS

| 3,627,416 | 12/1971 | Benson | 355/89 |
| 3,734,616 | 5/1973 | Mayhew et al. | 355/89 |
| 4,050,574 | 9/1977 | Chenevard et al. | 271/196 X |
| 4,375,285 | 3/1983 | Dennhardt | 271/11 |

Primary Examiner—L. T. Hix
Assistant Examiner—Brian W. Brown
Attorney, Agent, or Firm—Robert J. Koch

[57] ABSTRACT

An apparatus for the exposure of photosensitive plates on two sides, in particular for the preparation of printed circuits for electronic devices, comprises two similar exposure devices, mechanically connected and arranged adjacent to each other, each being equipped under a copying frame with an illuminating system, wherein a glass plate filling the format is arranged in the copying frame onto which a negative or positive master may be placed, together with a photosensitive plate above it, with a reversing station being associated with each of the exposure devices and both between each exposure device and the reversing station associated with it, and between the reversing stations a pivoting arm rotatable by 180 degrees each being arranged. The light source of each exposure device is arranged in or under the associated reversing station, wherein the beam of light may be conducted to the plate to be exposed of each exposure station. The first exposure device may be connected by means of a plate transport mechanism controlled by the exposure device with a stacking carriage. The second exposure device may be connected with a plate transport mechanism controlled by the exposure device for the removal of the exposed plates from the exposure device and their further transportation.

10 Claims, 5 Drawing Figures

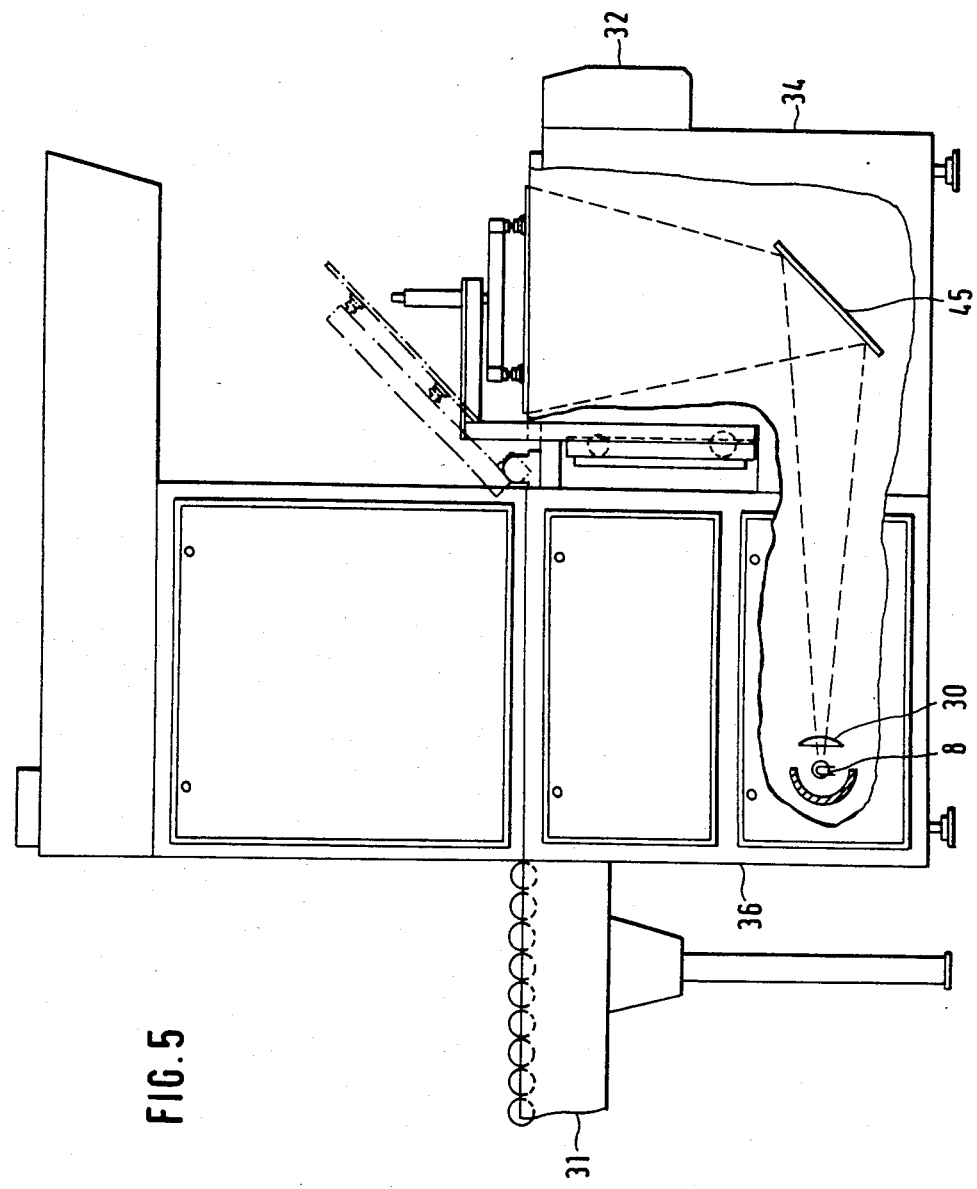

APPARATUS FOR THE EXPOSURE OF PHOTOSENSITIVE PLATES ON TWO SIDES

BACKGROUND OF THE INVENTION

1. Field of the Invention

The invention concerns an apparatus for the exposure of photosensitive plates on both sides. More particularly, the invention concerns the preparation of printed circuits for electronic devices or the preparation of light sensitive printing plates wherein two exposure devices are arranged adjacent each other. Each exposure device is provided under the exposure frame with an illumination system and with a glass plate filling the format being arranged in the exposure frame. A positive or negative copy may be placed, on the glass with the photosensitive plate above it for the exposure process.

2. Background of the Art

Photosensitive plates, in particular for the preparation of printed circuits for electronic circuits, comprise a support layer, preferably of a composite material made of an insulating substance and metal foil, mainly copper, upon which a layer of a photosensitive synthetic plastic layer is placed by means of a layer of an adhesive. Hardening takes place in the locations of the plastic layer exposed to light by the formation of polymers, while the unexposed parts are dissolved out after the exposure process, to the support material. The exposure of the synthetic plastic layer is brought about by placing a negative or a positive copy of the same size directly onto the photosensitive plate. Predetermined exposure times are required by means of UV light sources located below the photosensitive plate. The term "exposure" signifies herein that the locations of the resist are polymerized due to the action of the UV light on the synthetic plastic layer exposed through the master. In the process the monomer components are cross-linked and the resulting polymer is insoluble in the subsequent developing process. In order to obtain an exact reproduction of the master, it is necessary to use a light beam as parallel as possible. In addition, the master must be aligned accurately on the base material for proper reproduction.

In the preparation of printed circuits the objective is to carry the resolution capability as far as possible so that reductions in size of the electronic circuits become possible. In the copying process to obtain high resolutions all interferences for example by dust particles must be eliminated. For this and other reasons (to be mentioned later) "contactless" copying is desirable. In the process, a distance of approximately 1/10 to 2/10 mm is to be maintained between the master and the photosensitive material so that a flow of air may be passed through the gap by means of a suitable blower. In this fashion the settling of dust particles is prevented. "Contactless" copying further tends to preserve the master so that a practically endless number of copies may be produced from a single negative or positive master. However, to obtain "contactless" copying it is necessary to provide an incident light beam of the source of light that is as perpendicular as possible.

In the case of plates with large surface areas to be exposed, this requires that the source of light be removed from the plate to be exposed as far as possible. In this manner, a more uniform exposure of all areas of the surface is also obtained.

SUMMARY OF THE INVENTION

It is thus an object of the invention to provide an apparatus for automatically exposing both sides of photosensitive plates, whereby the "contactless" copying of a large series may be effected with the automatic feeding and removal of the plates.

It is a further object of the invention to expose the plates to light beams that are as perpendicular as possible in their incidence and further to avoid conditions whereby exposure processes necessarily must be performed under a vacuum or a reduced pressure.

These and other objects are achieved according to the invention by a reversing station associated with each of two exposure devices. In addition a pivoting arm reversible by 180 degrees is arranged between each exposing apparatus and the corresponding reversing station as well as between the reversing devices. A fully automatic flow of the material is made possible while the reversing stations are capable of improving the control of light, which in turn makes "contactless" copying feasible.

In a further embodiment of the invention, the light source of each of the exposure devices is arranged in or below the corresponding reversing station. The beam of light may therefore be directed at the plate to be exposed by means of an optical system.

This measure considerably extends the optical path of the beam whereby the angle of incidence of the beam is improved so that "contactless" copying becomes possible.

To assure the automatic flow of the material and continuous copying, a further embodiment of the invention utilizes a stacking carriage connected to the first exposure installation by means of a plate transport mechanism. The transport mechanism is controlled by the exposure apparatus.

In order to further insure the removal of the exposed material for transportation to subsequent processing stations in a similarly favorable manner, the second exposure apparatus may also be connected with a plate transport device controlled by the exposure apparatus for the removal and further transport of exposed plates from the exposure station.

The apparatus according to the invention further permits an advantageous utilization of space. It is thereby possible to guide the flow of materials around a right angle. For the purpose, according to the invention, a transport device is provided for the reversing station.

According to the invention, the plates to be exposed are transported automatically. For this purpose it is advantageous to provide pivoting arms according to the invention with a forked configuration for the gripping of the plates. The distance of the fork tines of one pivot arm are different from the distance of the tines of an adjacent pivot arm, so that the plane defined by the tines of one pivot arm may penetrate the plane defined by the tines of the other pivot arm.

This measure renders the favorable cooperation of the pivot arms within a minimum of time possible.

To obtain the necessary positioning accuracy in each of the reversing stations or exposure devices and in addition on the stacking carriage, the loading surfaces and the plate transport device have an indexing system with at least two locating pins. According to this further embodiment the necessary positioning accuracy of the plates is assured in each station of the apparatus.

According to the invention, the plates are taken up for their transportation with the aid of pneumatically-controlled-reduced-pressure suction cups, located on the bottom side of the fork tines.

This renders possible a very rapid gripping of the plates to be transported and provides a cautious and gentle mode of transportation.

BRIEF DESCRIPTION OF THE DRAWINGS

The invention will become more apparent from the embodiments shown in the drawing. In the drawing:

FIG. 5 shows a lateral elevation of another form of the apparatus with a partially open representation of the exposure device with a lighting system.

DETAILED DESCRIPTION OF THE EMBODIMENTS

Figure 1:
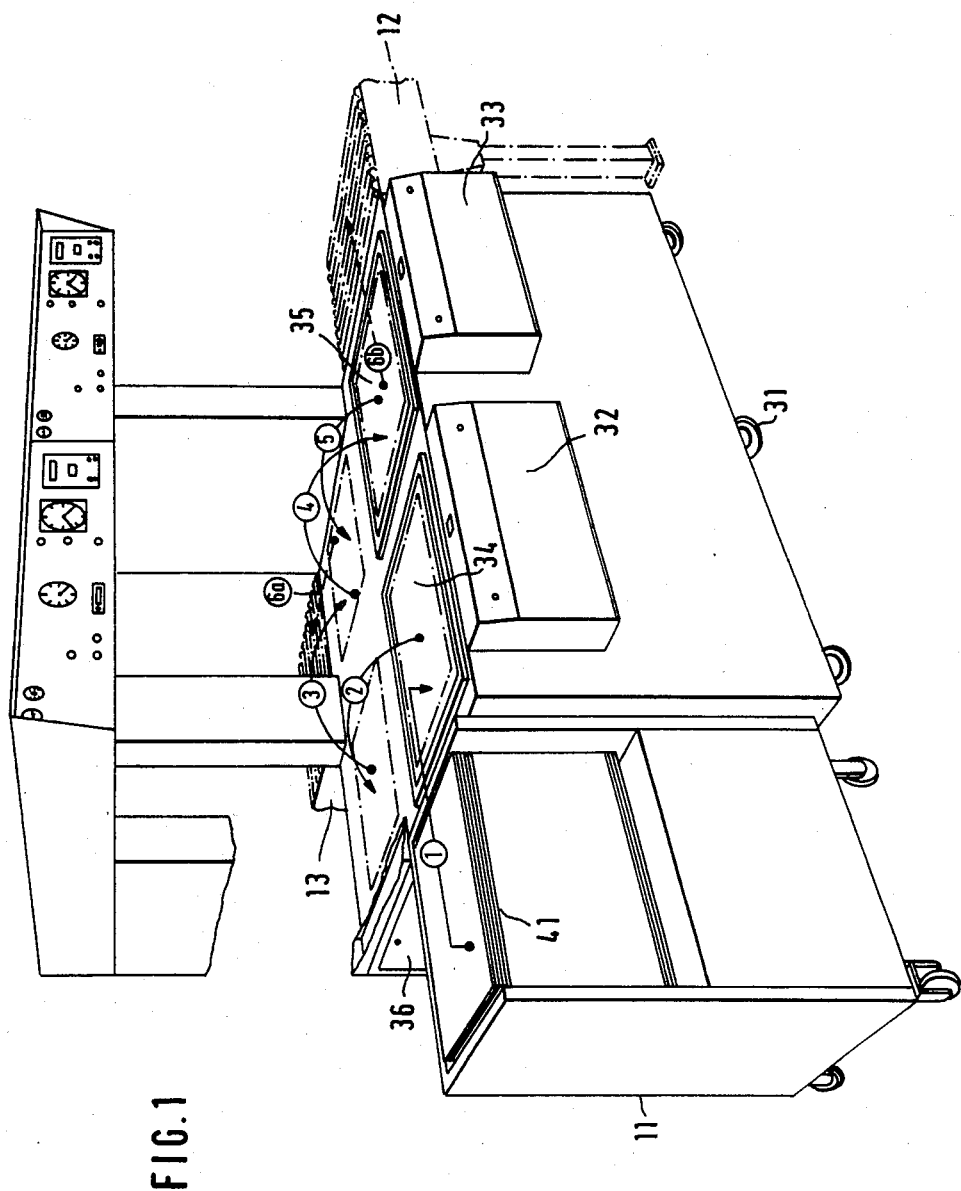
FIG. 1 shows a perspective view of the apparatus of the invention.

In the figures, like elements are provided with like reference symbols. FIG. 1 shows the entire installation in a perspective view. The exposure devices 34 and 35 and the reversing stations 36 and 37 are assembled into a closed unit. A stacking carriage 11 is associated with the exposure device 34; it is connected releasably with the aid of the transport mechanism 10 (see FIG. 2) mechanically with the exposure device 34. The entire installation is movable, as indicated by the rollers 31. A plate transport device 12 is provided for the exposure device 35 to remove the exposed plates. Alternatively, a plate transport device 13 may be connected with the reversing station 37 so that the entire flow of transport is at right angles. The installation may thereby be adapted to the given conditions of space.

A control unit 32 and 33 is associated which each of the exposure devices 34 and 35; they are not part of the invention and are not described in detail.

Figure 3:
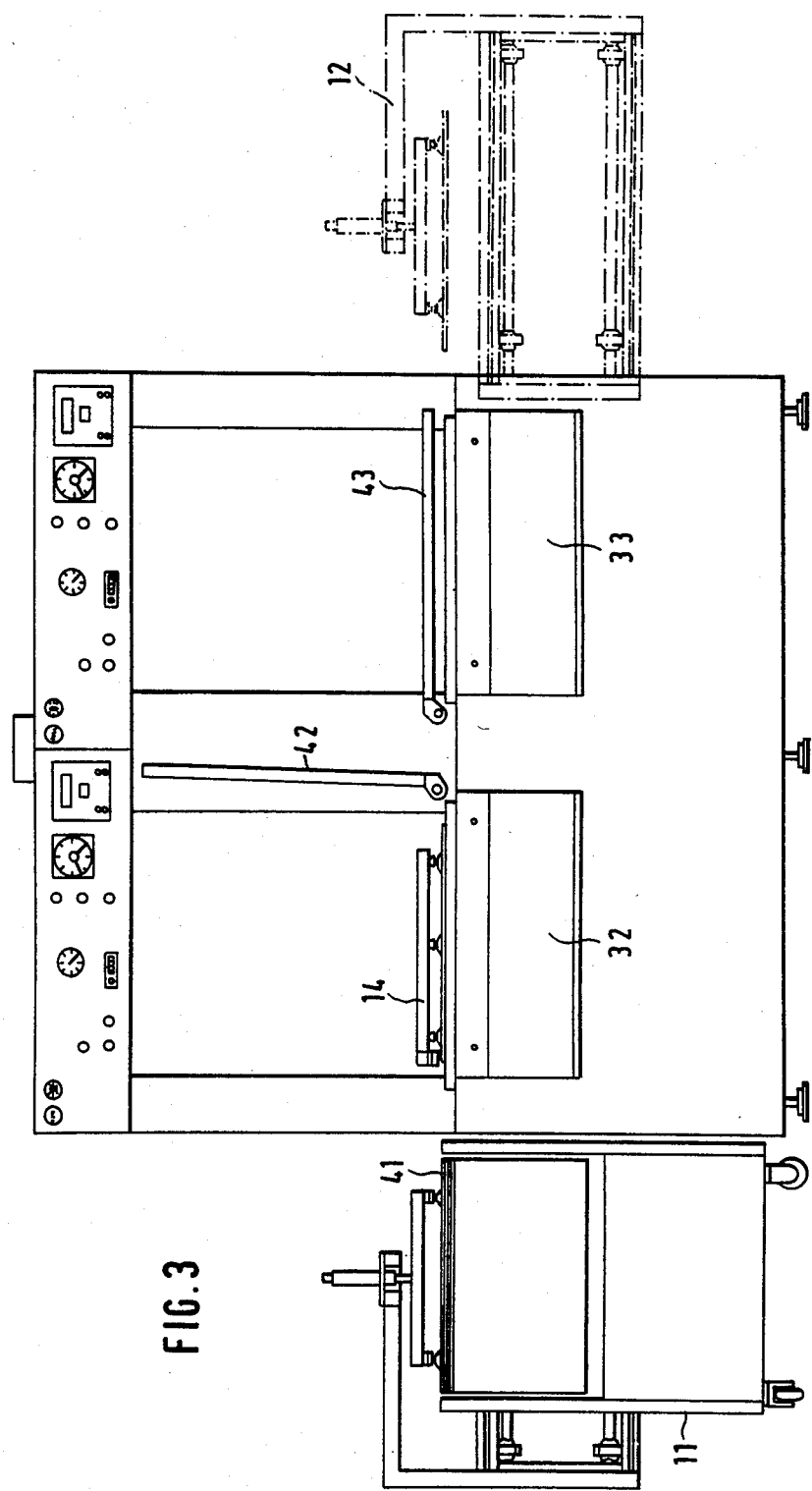
FIG. 3 shows a front elevation.

The arrows 1 to 6b in FIG. 1 indicate the flow of materials during the copying operation. The plates 41 on the stacking carriage 11 are raised individually by means of a spring device high enough so that the transport mechanism 10 is able to grip the top plate, remove it from the stacking carriage and transport it in the direction of the arrow 1 to the exposure station 34, which at this point in time is opened by means of the upwards pivoting of the flap 42 (see FIG. 3). The transport mechanism 10 places the plate exactly onto the exposure device.

Figure 2:
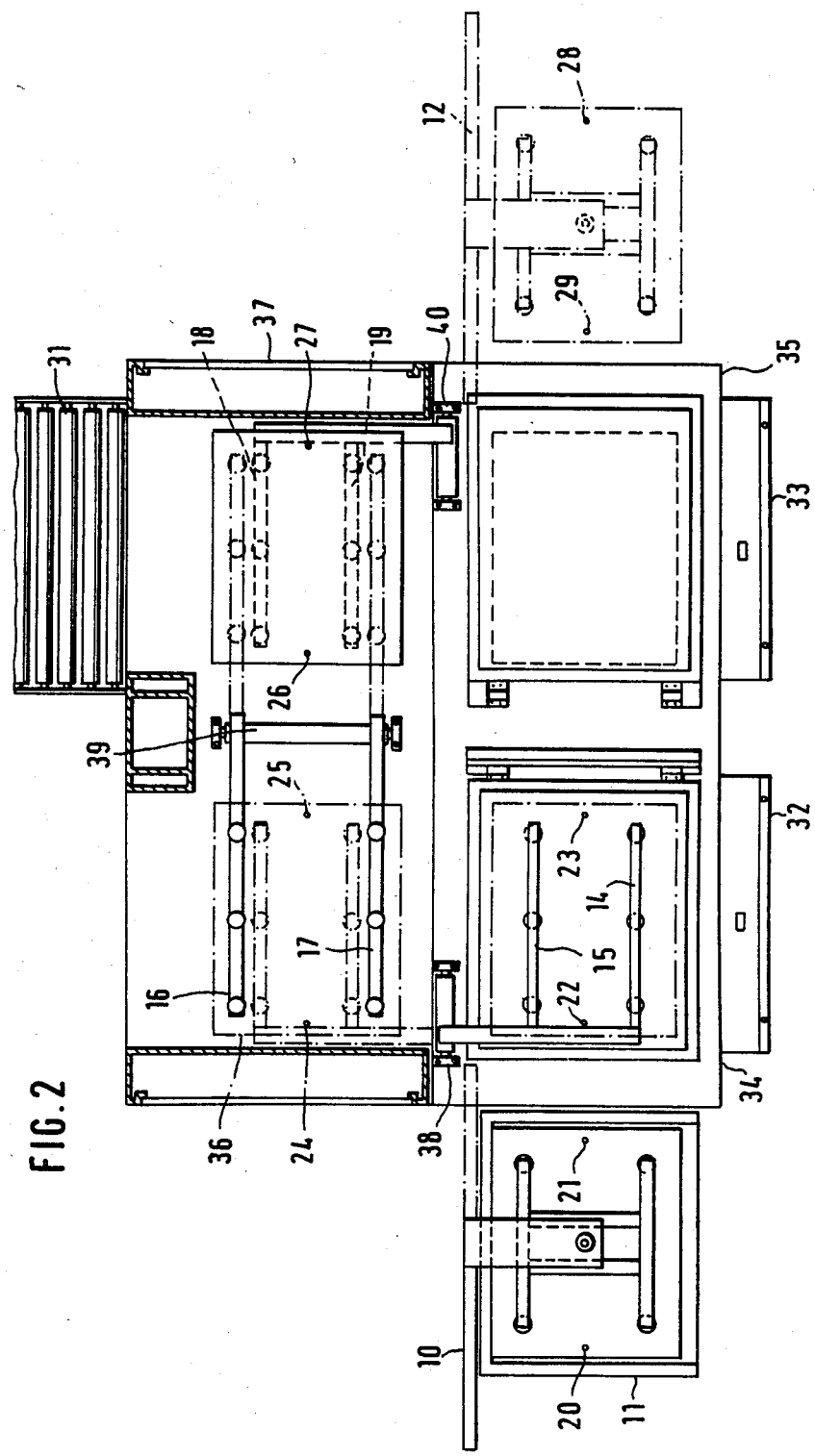
FIG. 2 represents a top view.

In order to obtain and assure the accurate positioning and alignment of the plates, in each exposure device and reversing station and in the stacking carriage 11, two locating pins 20 to 29 each, are shown in FIG. 2. The plates have corresponding bore holes so that an accurate alignment is effected. As the plates 41 are to be exposed on both sides, it is necessary to pivot them by 180 degrees. However, direct pivoting from the exposure station 34 to the exposure station 35 is not possible, as the cover flaps 42 and 43, which must be actuated from the front side for every exposure process, are in the way. Furthermore, it would be necessary to provide two pivoting arms taking the plate from each other, as the pivoting arm is not capable of penetrating the plane in which the master is located. For these reasons, the gripping, pivoting by 180 degrees and deposition of a plate 41 from the exposure station 34 to the reversing station 36 are effected by means of the pivot arm 38. The pivoting motion is indicated by the arrow 2 in FIG. 1. In a similar manner, the plate located on the reversing station 36 is again pivoted by 180 degrees by means of the pivot arm 39, as indicated by the arrow 3 in FIG. 1 and placed onto the station 37. As soon as the exposure station 35 is ready to receive another plate, the plate on the station 37 is seized by the pivot arm 40 and again pivoted by 180 degrees in the direction of the arrow 4 in FIG. 1 and placed onto the exposure station 35.

Depending on the configuration of the apparatus, the plate now exposed on both sides may be moved in the direction of the arrow 6b in FIG. 1 to the plate transport device 12 or seized again by the pivot arm 40 and again transported in the direction of the arrow 5 in FIG. 1 to the reversing station 37. From here, the further transportation of the material takes place.

FIG. 2 illustrates the configuration of the pivot arms. To grip the plates 41, each pivot arm 38, 39 and 40 has a fork like configuration, wherein the spacing of the fork tines 14, 15 and 16, 17 and 18, 19, respectively of a pivot arm 38, 39 and 40 is different with respect to the spacing of the tines of each adjacent pivot arm, so that the plane defined by the tines of a pivoting arm may penetrate through the plane defined by the tines of the other pivot plane. This is illustrated for example by the indication by a broken line of the pivot arm 38 in the reversing station 36. The tines 16 and 17 of the pivot arm 39 are already in the corresponding recesses of the reversing station 36, when the pivot arm 38 delivers the plate exposed in the exposure station 34 to the reversing station 36. Due to the appropriate dimensioning of the spacing of the fork tines, their planes may mutually penetrate each other, so that the deposition process shown is assured. The locating pins here again insure the correctly aligned placement of the plates. Immediately following the deposition of the plate 41 in the station 36, the pivot arm 39 may execute the pivoting and transport process to the reversing station 37, whereby the plate is again reversed by 180 degrees. In the reversing station 37 the plate therefore is in the same position as in the exposure station 34.

Here again the pivot arm 40 is located in the corresponding recesses in the reversing station 37, when with the aid of the pivot arm 39 the plate is pivoted in the direction of the arrow 3 and deposited. By the further pivoting of the plate to be exposed by 180 degrees with the aid of the pivot arm 40, the correct positioning and deposition of the plate in the exposure station 35 is effected. As the result of pivoting the plate by 180 degrees three times, the plate is now located in comparison with its position in the exposure station 34 so that the already exposed side of the plate is directed upwardly.

Following the execution of the exposure process, the transport mechanism 12, which is also equipped with suction cups, is actuated and grips the plate, now exposed on both side, in order to transport it out of the apparatus.

As described hereinabove in relation to FIG. 1, it is further possible to move the exposed material in the direction of the arrow 4 to the reversing station and then to remove the exposed plate by means of the transport device 31. Here again the pivot arm 40 in FIG. 2 is used, which with synchronous actuation seizes the exposed plate following the opening of the flap 43 (see FIG. 3) of the exposure station 35 and again transports it to the reversing station 37. A device similar to the means of transportation then seizes the exposed plate in the reversing station 37 and moves it through the transport device 31 to further processing stations.

Figure 4:
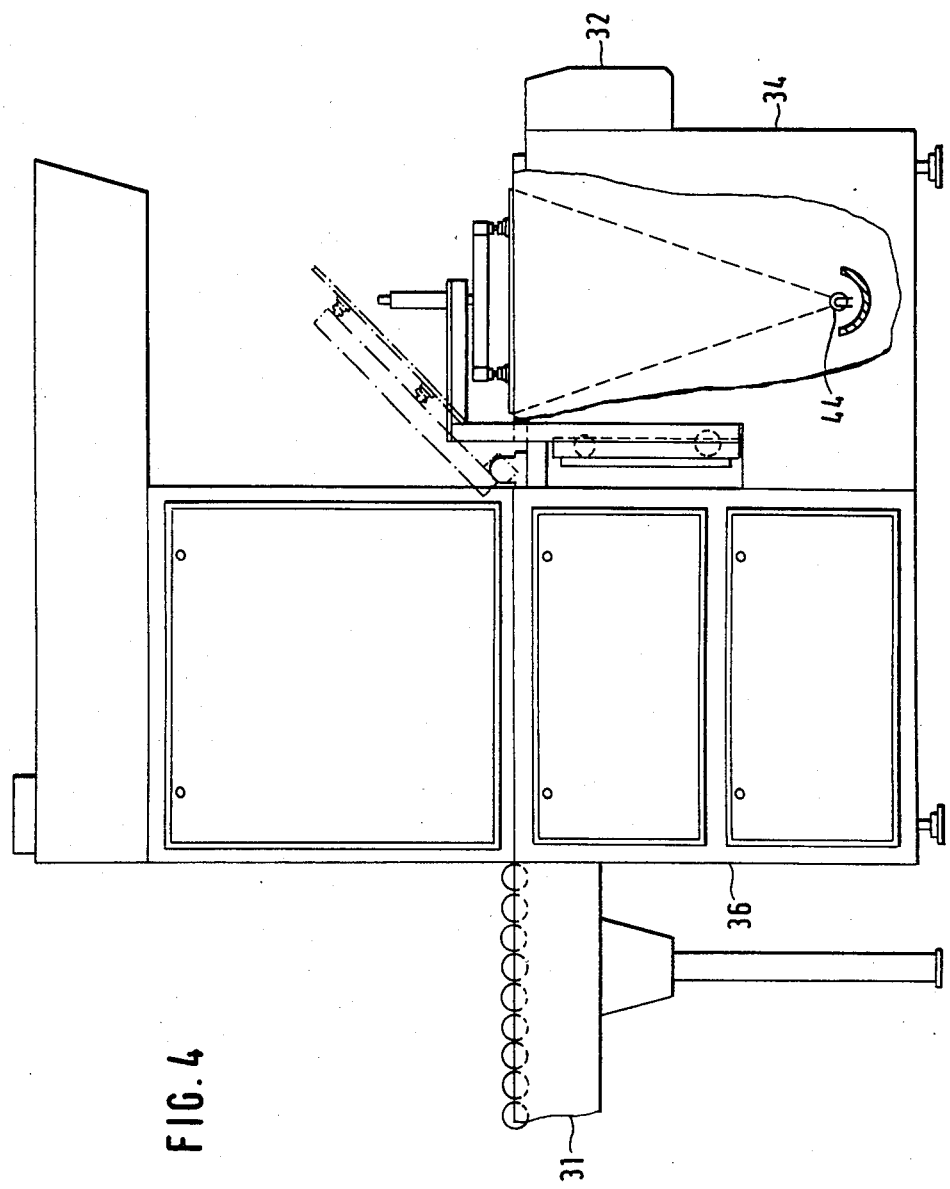
FIG. 4 depicts a lateral elevation of oneform of the apparatus with a partially open representation of the exposure device.

FIG. 4 shows the arrangement of a light source 44 in the conventional manner, i.e. the light source 44 is located directly under the plate to be exposed. As seen from the beam path indicated, the incidence of the light is relatively oblique so that with a beam path of this type it is not possible to copy in a "contactless" manner, while achieving the highest accuracy.

FIG. 5 shows the location of the light source 8 under the reversing station 36. It is possible in this manner to obtain a longer path of the beam so that the angle of incidence approaches a right angle. An optical system consisting of the lens 30 and the mirror 45 provides the beam path desired.

The entire apparatus operates synchronously and in a fully automatic manner so that a continuous flow of the work is assured, together with the maximum utilization of the times determined by the exposure time. By means of the arrangement of the light sources in or under the associated reversing device, it is possible to obtain a nearly perpendicular incidence of the beam on the material to be exposed. This in turn makes it possible to execute the "contactless" copying desired. An air gap exists between the master and the plate to be copied through which a flow of air may be passed whereby the settling of dust particles may be prevented. This working method further assures the fact that it is no longer necessary to operate in a vacuum or under reduced pressure. The pumping devices and seals required are eliminated, together with the time needed for pumping. The work flow of the entire apparatus may thereby be substantially accelerated, with only the exposures times determining the cycle of the system.

By means of the application of "contactless" copying, the negative or positive master is treated in an extraordinarily gentle manner. As a result of this, virtually an unlimited manner of copies may be produced from a single master.

The apparatus according to the invention is particularly suitable for a novel, integrated system of the preparation of printed circuits wherein no protective foil is required. This system assumes that the exposure is effected at an exactly defined distance from the negative or positive master in order to obtain reproducible results. The installation according to the invention assures absolutely constant exposure times so that the integrated system, which provides higher resolution capabilities, may be used.

What is claimed is:

1. An apparatus for the exposure of photosensitive plates on two sides comprising, two exposure devices each for exposing one side of a photosensitive plate and being mechanically connected and arranged adjacent to each other, two illuminating devices each associated with one of said exposure devices, two glass plates each associated with one of said exposure devices for supporting a master and a photosensitive plate in relation to said exposure devices, means for transporting and reversing a photosensitive plate between said two exposure devices and including two reversing stations each associated with one of said exposure devices and pivoting arm means rotatable by 180 degrees between said exposure devices and said transporting and said reversing stations, whereby a photosensitive plate is removed from one of said exposure devices after exposure and is inverted and transferred to the reversing station associated with said one of said exposure devices, and is then inverted and transferred to the other of said reversing stations, and is then inverted and transferred to the other of said exposure devices for exposure of the other side of said photosensitive plate.

2. An apparatus as in claim 1 and including an optical system for directing the light from said illuminating devices to said photosensitive plates.

3. An apparatus as in claim 1 and including a stacking carriage connected to said one of said exposure devices and means for transporting a plate from said stacking carriage to said one of said exposure devices.

4. An apparatus as in claim 3 and including a plate transport device connected to and controlled by the other of said exposure devices for removing exposed photosensitive plates from said other of said exposure devices.

5. An apparatus as in claim 1 and wherein said transporting and reversing means includes a first transport arm between said one of said exposure devices and its associated reversing station, a second transport arm between said reversing stations, and a third transport arm between said other exposure station and its associated reversing station, each of said transport arms comprising a pair of spaced tines, the spacing of the tines of each transport arm being different from the tines of the other transport arms so as to enable intermeshing of the tines of adjacent transport arms.

6. An apparatus as in claim 5 and including locating means on each of said exposure devices and said reversing stations for positioning a photosensitive plate thereon.

7. An apparatus as in claim 5 and including suction operated gripping means on each of said tines for gripping the photosensitive plates.

8. An apparatus as in claim 2 and wherein said optical system includes means for elongating the optical path between said illuminating devices and the photosensitive plates whereby light incident upon the photosensitive plates is nearly perpendicular to the plates.

9. An apparatus as in claim 1 and wherein said photosensitive plates are printed circuit boards after exposure processing.

10. An apparatus as in claim 1 and wherein said photosensitive plates are printing plates after exposure processing.

* * * * *